US009731663B2

(12) United States Patent
Broughton et al.

(10) Patent No.: US 9,731,663 B2
(45) Date of Patent: *Aug. 15, 2017

(54) ELECTRICAL HARNESS CONNECTOR

(71) Applicant: ROLLS-ROYCE PLC, London (GB)

(72) Inventors: Paul Broughton, Leicester (GB);
Jonathan Wilson, Ashby-de-la-Zouch (GB)

(73) Assignee: ROLLS-ROYCE plc, London (GB)

(*) Notice: Subject to any disclaimer, the term of this patent is extended or adjusted under 35 U.S.C. 154(b) by 371 days.

This patent is subject to a terminal disclaimer.

(21) Appl. No.: 14/260,614

(22) Filed: Apr. 24, 2014

(65) Prior Publication Data

US 2014/0325993 A1    Nov. 6, 2014

(30) Foreign Application Priority Data

May 3, 2013  (GB) .................................. 1308029.6

(51) Int. Cl.
*B60R 16/02*     (2006.01)
*H01R 43/20*    (2006.01)
(Continued)

(52) U.S. Cl.
CPC ............ *B60R 16/0207* (2013.01); *F02C 7/00* (2013.01); *H01R 12/77* (2013.01); *H01R 13/52* (2013.01);
(Continued)

(58) Field of Classification Search
CPC ................ B60R 16/0207; H01R 43/20; H05K 2201/05; H05K 2201/10189
(Continued)

(56) References Cited

U.S. PATENT DOCUMENTS 4,526,432 A   7/1985 Cronin et al.
4,647,133 A   3/1987 Renken et al.
(Continued)

FOREIGN PATENT DOCUMENTS

DE     10146626 A1    4/2003
EP     0 106 990 A1    5/1984
(Continued)

OTHER PUBLICATIONS

Jan. 29, 2015 Search Report issued in European Application No. 14 16 2597.

(Continued)

*Primary Examiner* — Christopher Demeree
(74) *Attorney, Agent, or Firm* — Oliff PLC

(57) ABSTRACT

An electrical harness assembly is provided that comprises a flexible printed circuit electrically connected to one end of an electrical connector. The other end of the electrical connector is presented for connection to another electrical component. Electrical tracks or conductors in the flexible printed circuit terminate in receiving holes. The electrical connector comprises terminals, each of which has a first end that is received in one of the receiving holes to form a connection formation, and a second end which is present for connection to the other electrical device. The connection formation is encapsulated so as to be sealed, thereby providing a reliable and robust connection between the connector and the flexible printed circuit.

15 Claims, 5 Drawing Sheets

(51) Int. Cl.
*H01R 12/77* (2011.01)
*H01R 13/52* (2006.01)
*F02C 7/00* (2006.01)
*H05K 1/18* (2006.01)

(52) U.S. Cl.
CPC ....... *H01R 43/20* (2013.01); *F05D 2300/603* (2013.01); *H05K 1/189* (2013.01); *H05K 2201/05* (2013.01); *H05K 2201/10189* (2013.01); *Y02T 50/672* (2013.01); *Y10T 29/49208* (2015.01)

(58) Field of Classification Search
USPC ...................... 60/796, 801; 174/254; 29/876; 439/606, 76.1, 493
See application file for complete search history.

(56) References Cited

U.S. PATENT DOCUMENTS

| | | | |
|---|---|---|---|
| 4,975,068 A | 12/1990 | Squires | |
| 5,194,010 A | 3/1993 | Dambach et al. | |
| 5,470,238 A * | 11/1995 | Walden | H01R 23/662 439/108 |
| 5,482,473 A | 1/1996 | Lord et al. | |
| 5,567,167 A | 10/1996 | Hayashi | |
| 5,620,782 A | 4/1997 | Davis et al. | |
| 5,664,964 A * | 9/1997 | Crofoot | H01R 43/24 439/495 |
| 5,770,818 A | 6/1998 | Tanaka et al. | |
| 5,805,402 A | 9/1998 | Maue et al. | |
| 5,827,081 A | 10/1998 | Sakamaki | |
| 5,984,724 A | 11/1999 | McNeel | |
| 6,010,370 A | 1/2000 | Aihara et al. | |
| 6,024,580 A | 2/2000 | Dangler et al. | |
| 6,299,469 B1 | 10/2001 | Glovatsky et al. | |
| 6,445,350 B2 * | 9/2002 | Takenobu | H01Q 1/1271 343/713 |
| 7,033,208 B1 | 4/2006 | Huang et al. | |
| 7,095,601 B2 | 8/2006 | Mehrer et al. | |
| 7,223,105 B2 | 5/2007 | Weiss et al. | |
| 7,553,166 B2 | 6/2009 | Gobron | |
| 7,731,517 B2 | 6/2010 | Lee et al. | |
| 7,980,863 B1 | 7/2011 | Holec et al. | |
| 8,529,276 B2 | 9/2013 | Esquivel et al. | |
| 8,529,277 B2 | 9/2013 | Williams et al. | |
| 8,668,503 B2 | 3/2014 | Williams et al. | |
| 8,956,166 B2 | 2/2015 | Ritner | |
| 9,178,295 B1 | 11/2015 | Lin et al. | |
| 9,338,830 B2 * | 5/2016 | Broughton | H05B 3/28 |
| 2003/0092295 A1 | 5/2003 | Lin | |
| 2003/0092296 A1 | 5/2003 | Oldenburg et al. | |
| 2004/0018757 A1 | 1/2004 | Lang et al. | |
| 2005/0079772 A1 | 4/2005 | DeLessert | |
| 2005/0118864 A1 | 6/2005 | Watanabe et al. | |
| 2007/0184682 A1 | 8/2007 | Gobron | |
| 2009/0233465 A1 | 9/2009 | Mizoguchi | |
| 2012/0103685 A1 | 5/2012 | Blanchard et al. | |
| 2012/0315773 A1 | 12/2012 | Esquivel et al. | |
| 2012/0315774 A1 | 12/2012 | Williams et al. | |
| 2013/0114220 A1 * | 5/2013 | Broughton | H01R 12/585 361/752 |

FOREIGN PATENT DOCUMENTS

| | | |
|---|---|---|
| EP | 0 198 566 A2 | 10/1986 |
| EP | 0 261 527 A2 | 3/1988 |
| EP | 0 440 305 A1 | 8/1991 |
| EP | 0 911 913 A2 | 4/1999 |
| FR | 2 830 375 A1 | 4/2003 |
| GB | 929802 | 6/1963 |
| GB | 2 070 349 A | 9/1981 |
| GB | 2461017 A | 12/2009 |
| GB | 2463867 A | 3/2010 |

OTHER PUBLICATIONS

Mar. 21, 2016 Office Action issued in U.S. Appl. No. 13/659,324.
Apr. 8, 2016 Office Action issued in U.S. Appl. No. 14/260,610.
British Search Report for Application No. 1308029.6 issued Oct. 28, 2013.
British Search Report for Application No. 1308028.8 issued Oct. 28, 2013.
Search Report issued in British Application No. 1119050.1 dated Mar. 2, 2012.
Search Report issued in British Application No. 1219084.9 dated Feb. 27, 2013.
Search Report issued in British Application No. 1219088.0 dated Feb. 22, 2013.
Search Report issued in British Application No. 1119045.1 dated Mar. 2, 2012.
U.S. Appl. No. 13/659,324, filed Oct. 24, 2012.
Search Report issued in European Patent Application No. 12 18 9697 dated Apr. 4, 2013.
U.S. Appl. No. 13/659,336, filed Oct. 24, 2012.
May 5, 2014 Office Action issued in U.S. Appl. No. 13/659,336.
U.S. Appl. No. 14/260,610, filed Apr. 24, 2014.
May 19, 2014 Office Action issued in U.S. Appl. No. 13/659,324.
Search Report issued in European Patent Application No. 14 16 2598 dated May 28, 2014.
Oct. 20, 2015 Office Action issued in U.S. Appl. No. 13/659,324.
Nov. 3, 2014 Office Action issued in U.S. Appl. No. 13/659,324.
Dec. 20, 2016 Office Action issued in U.S. Appl. No. 14/260,610.
Apr. 23, 2015 Office Action issued in U.S. Appl. No. 13/659,324.
Jun. 2, 2017 Office Action issued in U.S. Appl. No. 14/260,610.

* cited by examiner

ELECTRICAL HARNESS CONNECTOR

CROSS-REFERENCE TO RELATED APPLICATIONS

This application is based upon and claims the benefit of priority from British Patent Application Number 1308029.6 filed 3 May 2013, the entire contents of which is incorporated by reference.

BACKGROUND OF THE INVENTION

1. Field of the Disclosure

The present invention relates to providing an electrical harness with a connector, the electrical harness being formed from a flexible printed circuit which provides a plurality of conductive tracks.

2. Description of the Related Art

With reference to FIG. 1, a ducted fan gas turbine engine generally indicated at 10 has a principal and rotational axis X-X. The engine comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. A nacelle 21 generally surrounds the engine 10 and defines the intake 11, a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines respectively drive the high and intermediate pressure compressors 14, 13 and the fan 12 by suitable interconnecting shafts.

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, are commonly transmitted along conductors. Conventionally, such conductors may be in the form of wires and cables which are assembled together in a harness. In such a conventional harness, each wire may be surrounded by an insulating sleeve. The connections between the individual components and the conventional harness are made, for example, by multi-pin plug and socket connectors. Similarly, communication between the harness and power, control and signalling circuitry is achieved through a multi-pin connector.

By way of example, FIG. 2 shows a typical gas turbine engine including two conventional wiring harnesses 102, 104, each provided with a respective connector component 106, 108 for connection to circuitry accommodated within the airframe of an aircraft in which the engine is installed.

The harnesses 102, 104 are assembled from individual wires and cables which are held together over at least part of their lengths by suitable sleeving or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 therefore comprises a multitude of insulated wires and cables. This makes the conventional harness bulky, heavy and difficult to manipulate. It is desirable to reduce the size and weight of components on gas turbine engines, particularly, for example, gas turbine engines for use on vehicles, such as aircraft.

It is proposed to replace conventional harnesses with flexible printed circuit board harnesses (FPCB harnesses). An example of a portion of a flexible printed circuit board harness (which may be referred to simply as a flexible printed circuit harness) 120 is shown in FIGS. 3 to 6. FIG. 3 shows a perspective view of an FPCB harness portion, and FIGS. 4, 5, and 6 show side, top, and cross-sectional views respectively.

The FPCB harness 120 typically comprises a flexible (for example elastically deformable) substrate 140 with conductive tracks 130 laid/formed therein. The FPCB harness 120 may thus be deformable. In the example shown in FIGS. 3 to 6, the FPCB harness 120 extends along a length in the x-direction, a width in the y-direction, and a thickness (or height or depth) in the z-direction. The x direction may be defined as the axial direction of the FPCB harness. Thus, the x-direction (and thus the z-direction) may change along the length of the FPCB harness 20 as the FPCB harness is deformed. The x-y surface(s) may be said to be the major surface(s) of the FPCB harness. In the example shown in FIGS. 3 to 6, the FPCB harness is deformable in the z direction, i.e. in a direction perpendicular to the major surface. FPCB harnesses may be additionally of alternatively deformable about any other direction, and/or may be twisted about any one or more of the x, y, or z directions.

The flexible substrate 140 is typically a dielectric, and the conductive tracks 130, which may be surrounded by the substrate, are typically formed using a suitable conductive material. The conductive tracks 130 may be used to conduct/transfer electrical signals and/or electrical power, for example around a gas turbine engine and/or to/from components of a gas turbine engine. The size (for example the cross-sectional area) and/or the shape of the conductive tracks 130 can depend on the signal to be transmitted through the particular conductive track 130. Thus, the shape and/or size of the individual conductive tracks 130 may or may not be uniform in a FPCB harness 120.

The example shown in FIGS. 3 to 6 has two layers of conductive tracks 130 running through the substrate 140, with three tracks in each layer. However, the number of layers and the number of tracks in the FPCB harness 120 can vary.

Using an FPCB harness to transmit electrical signals and/or power can be advantageous over a conventional harness, for example because of its reduced size, weight and/or complexity.

FIG. 7 shows a diagrammatic representation of an FPCB harness for an engine. The harness comprises a trunk 136 extending between connectors 141, 142, and a plurality of integral spurs 144 terminating at connectors 146. The trunk 136 and spurs 144 are generally flat, parallel to the plane of FIG. 7, but may be curved in that plane for ease of routing of the harness over the gas turbine engine. At least some of the tracks of the FPCB extend both along the trunk 136 and the respective spurs 144.

OBJECTS AND SUMMARY

It is desirable to be able to connect the flexible printed circuit harnesses to other electrical components in a robust, reliable manner. This may be particularly important for gas turbine engine applications, which may be safety-critical and subject to a harsh environment, such as high levels of temperature and/or vibration.

According to an aspect, there is provided an electrical harness assembly. The electrical harness assembly comprises an electrical harness having a flexible printed circuit with a plurality of conductive tracks, and a terminating region at which each conductive track terminates at a receiving hole. Each receiving hole is electrically connected to its respective electrical track. The electrical harness assembly comprises an electrical connector comprising elongate terminals. Each elongate terminal has a first end received in one of the receiving holes, thereby forming a connection formation at which the elongate terminals are electrically connected with the conductive tracks. Thus, the connection formation may be said to comprise the first ends of the elongate terminals and the terminating region. Each elongate terminal has a second end presented for connection to a complimentary connector. The electrical harness assembly comprises an encapsulating body that encapsulates the connection formation. The encapsulating body continuously surrounds the connection formation. The encapsulating body is in direct contact with the connection formation (for example with at least a part of the terminating region) so as to seal the connection formation therein.

There is also provided a method of providing an electrical harness with an electrical connector for connection to a complimentary connector, the electrical harness comprising a flexible printed circuit having a plurality of conductive tracks. The method comprises forming a terminating region of the electrical harness at which each conductive track terminates at a receiving hole, each receiving hole being electrically connected to its respective electrical track. The method comprises providing an electrical connector comprising elongate terminals each having a first end and a second end. The method comprises fitting the first end of each elongate terminal in a respective one of the receiving holes, thereby forming a connection formation at which the elongate terminals are electrically connected with the conductive tracks. Thus, the connection formation may be said to comprise the first ends of the elongate terminals and the terminating region. The method comprises presenting the second end of each elongate terminal for connection to a complimentary connector. The method comprises encapsulating the connection formation by surrounding the connection formation with an insulating material that is in direct contact with the connection formation (for example with at least a part of the terminating region) and seals the connection formation therein.

A method of manufacturing an electrical harness assembly including a connection formation comprising the above steps is also provided.

The connection formation may comprise additional features, which may also be sealed within the encapsulating body. For example, the connection formation may comprise a shielding layer, for example an electromagnetic shield. Such a shielding layer may, for example, be wrapped around and/or cover at least a part of the terminating region, and may itself be surrounded by (or encapsulated within) the encapsulating body.

Accordingly, a flexible printed circuit harness may be provided with a connector that allows it to be connected to other electrical components in a robust, reliable manner. Such a connection may be relatively small and/or lightweight, for example because it may only be necessary to provide enough insulating material as required to seal the connection formation.

Any optional features described herein may be applicable singly or in any combination with each other, and/or with any aspect of the invention.

The encapsulating body may be a homogeneous body formed around the connection formation. Thus, the insulating material may be homogeneous around the connection formation. This may enable the encapsulation to be relatively inexpensive and straightforward.

The encapsulating body may be a single body that continuously surrounds the connection formation. This may mean that the encapsulating body is formed around the connection formation as a single continuous entity, rather than as two or more entities fastened together around the connection formation. The encapsulating body may require no fixing means, such as screws or bolts, in order to be secured around, and encapsulate, the connection formation.

The encapsulating body may form a hermetic seal around the connection formation. The encapsulating body may robustly and reliably protect the connection formation (for example over a prolonged period, which may, for example, extend to the life of the connection formation and/or the harnesses). The encapsulating body may, for example, prevent the ingress of any fluid, such as any liquid and/or gas, into the connection formation.

The encapsulating body may form a permanent seal and/or non-releasable body around the connection formation. This may allow the body to form a more robust and reliable seal.

The encapsulating body may be formed from any suitable material, for example a mouldable insulating material. A mouldable plastic may be used to form the encapsulating body. An epoxy resin may be used to form the encapsulating body. Using an insulating material may help to ensure that the electrical connection between the electrical harnesses is electrically isolated.

An outer surface of the electrical harness assembly may be formed by the encapsulating body. Thus, in some examples, no further components may be required to complete the connection assembly. The encapsulating body itself may protect the connection formation, and its outer surface(s) may be exposed to the environment in which the assembly/connection formation operates.

The electrical connector may further comprise a housing. The elongate terminals may be supported therein such that their second ends are presented for connection to a complimentary connector at an open end of the housing. Such a housing may provide a convenient way to hold the elongate terminals in position.

The terminating region may be substantially planar. The one or more receiving holes may be arranged such that the elongate terminals extend out of the plane of the terminating region. The conductive tracks of the harness may fan out, and thus separate from each other, in the terminating region. The terminating region may be substantially disc-shaped.

The inner surface of the or each receiving hole may be coated with an electrically conducting layer. This may ensure that a robust electrical contact is maintained between the harnesses and the pins, and thus between the harnesses.

The receiving holes may be through holes or blind holes, as appropriate. The receiving holes may optionally include respective embedded sockets which engage with the ends of the pins and are connected to the conductive tracks of the respective harness.

The encapsulating body may comprise an aperture through which the electrical harness exits as it extends away from the terminating region. The electrical harness (i.e. the flexible printed circuit thereof) may be manipulated as desired in the region outside the encapsulating body. The encapsulating body may typically extend over a portion of the flexible printed circuit, although this may not be the case in some examples.

The encapsulating body may comprise an aperture through which the electrical connector extends. For example, the encapsulating body may comprise one aperture through which the flexible printed circuit extends and another aperture through which the electrical connector extends.

According to the method of providing an electrical harness with an electrical connector for connection to a complimentary connector and/or the method of manufacturing an electrical harness assembly including the connection formation described herein, the step of encapsulating the connection formation may comprise injection moulding the insulating material around the connection formation. Alternatively, any other suitable process may be used, for example simply pouring the mouldable material (in molten/liquid form) into a mould of the desired shape.

The process used to encapsulate the connection formation may depend on, for example, the production volume. By way of example, injection moulding may be more suitable for high volume production, whereas pouring the mouldable material into a mould may be more desirable for low volume production.

A seal, for example an elastomeric seal, may be provided around the harness prior to encapsulating the connection formation. This may help to prevent leakage of the insulating material used to form the encapsulating body during the encapsulation process. The seal may or may not be removed from the encapsulating body after the encapsulation has been completed.

According to an aspect, there is provided a gas turbine engine comprising an electrical system that has an electrical harness assembly as described and/or claimed above and elsewhere herein. The robust and reliable provision of an electrical connector may be particularly advantageous in the typically hostile environment of a gas turbine engine, which may be subject to high levels of temperature and vibration.

Such an electrical system may be used to transfer electrical signals around a gas turbine engine, for example through the flexible printed circuit. The electrical signals transferred by the conductive tracks in the electrical harness assembly may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in.

According to an aspect, the electrical harness assembly may be a part of a rigid electrical raft (which may be referred to as a rigid electrical structure). The rigid electrical raft may comprise at least a part of the electrical harness assembly embedded in a rigid material, for example a rigid composite material. Such an electrical raft may have embedded therein the connection formation, the encapsulating body and at least a part of the flexible printed circuit. The rigid material of the electrical raft may completely surround, and thus immobilize, the connection formation and at least a part of (for example all of) the flexible printed circuit. The rigid electrical raft (which may be referred to as an electrical raft or an electrical raft assembly) may thus be described as having a plurality of electrical conductors (which may themselves be provided in the flexible printed circuits) embedded in a rigid material.

A part of the electrical connector may be embedded in a rigid electrical raft, and a part of the electrical connector may extend out of the rigid electrical raft. Thus, a part of the electrical connector may be considered to be not embedded in the electrical raft. Thus, the second ends of the elongate terminals may extend away from the electrical raft so as to be available for connection to an external complimentary connector (i.e. a connector that is external to, or not integral with, the electrical raft).

In examples in which the electrical harness assembly is provided in a rigid electrical raft, the encapsulating body surrounding the connection formation may be particularly advantageous. For example, during manufacture of a rigid electrical raft, a resin may be injected into a mould, around the electrical harness assembly. The resin may be injected at a high pressure, and so the robust seal provided by the encapsulating body may provide the advantage of preventing the ingress of resin into the connection formation during manufacture of a rigid electrical raft.

Thus, the electrical harness assembly described and claimed herein may be particularly advantageous in facilitating the provision of an electrical connector to a flexible printed circuit within a rigid electrical raft. Alternatively or additionally, the electrical harness assembly may be used in conjunction with other electrical raft assemblies having electrical conductors embedded in a rigid material which may or may not have such an electrical harness assembly embedded therein.

Such a rigid electrical raft may be part of a gas turbine engine, for example part of an electrical system for a gas turbine engine. Again, the electrical signals transferred by the conductive tracks in the electrical harness assembly in such an electrical system may take any form, such as those given by way of example above.

Features and advantages of rigid electrical rafts are described below. It will be appreciated that at least some of these features may be particularly relevant to examples in which the electrical harness assembly is at least partially embedded in a rigid material to form a rigid electrical raft (which may be referred to below and elsewhere herein as an electrical raft or an electrical raft assembly).

Use of one or more electrical raft assemblies (which may have embedded therein the electrical harness assembly as described herein) may significantly reduce build time of an engine. For example, use of electrical raft assemblies may significantly reduce the part count involved in engine assembly compared with a conventional harness arrangement. The number and/or complexity of the operations required to assemble an engine (for example to assemble/install the electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical rafts/electrical raft assemblies, which themselves may be straightforward to handle, position, secure and connect. Thus, use of electrical raft assemblies in a gas turbine installation may reduce assembly time and/or reduce the possibility of errors occurring during assembly.

Use of electrical raft assemblies may provide significant advantages during maintenance, such as repair and overhaul. As discussed above, the electrical rafts may be particularly quick and straightforward to assemble. The same advantages discussed above in relation to assembly apply to disassembly/removal from the gas turbine engine. Thus, any repair/overhaul that requires removal of at least a part of the electrical harness may be simplified and/or speeded up through use of electrical rafts as at least a part of the electrical harness, for example compared with conventional harnesses. Use of electrical rafts (for example as part of one or more electrical raft assemblies) may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine.

However, it may be relatively straightforward to only remove the relevant electrical raft, for example by simply disconnecting it from the engine and any other electrical rafts/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical rafts and/or electrical raft assemblies prior to engine assembly. This may allow the electrical and/or mechanical operation of the electrical rafts to be proven before installation, thereby reducing/eliminating the testing required during engine installation.

The electrical rafts/electrical raft assemblies may be a particularly lightweight solution for transferring electrical signals around an engine. For example, an electrical raft may be lighter, for example significantly lighter, than a conventional harness required to transmit a given number of electrical signals. A plurality of conductors may be embedded in a single electrical raft, whereas in a conventional arrangement a large number of heavy, bulky wires, usually with insulating sleeves, would be required. The reduced weight may be particularly advantageous, for example, when used on gas turbine engines on aircraft.

Electrical rafts may be more easily packaged and/or more compact, for example than conventional harnesses. Indeed, as mentioned above, the electrical rafts can be made into a very wide range of shapes as desired. This may be achieved, for example, by manufacturing the electrical rafts using a mould conforming to the desired shape. As such, each electrical raft may be shaped, for example, to turn through a tighter corner (or smaller bend radius) than a conventional harness. The electrical rafts may thus provide a particularly compact solution for transferring electrical signals around a gas turbine engine. The electrical rafts may be readily shaped to conform to neighbouring components/regions of a gas turbine engine, for example components/regions to which the particular electrical raft assembly is attached, such as a fan casing or a core casing.

The electrical raft(s) may provide improved protection to the electrical conductors (including, for example, the conductive tracks in the flexible printed circuits that may be embedded in the raft) during manufacture/assembly of the raft/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

In examples comprising an electrical rigid raft, any suitable material may be used for the rigid material of the electrical raft. For example, the rigid material may be a rigid composite material, for example an organic matrix composite. Such a rigid composite material may be particularly stiff and/or lightweight. Thus, a rigid composite raft may be used that has suitable mechanical properties, whilst being thin and lightweight, for example compared with some other materials. The rigid composite material may comprise any suitable combination of resin and fibre as desired for a particular application. For example, any of the resins and/or fibres described herein may be used to produce a rigid composite material for the electrical raft. Any suitable fibres may be used, for example carbon fibres, glass fibres, aramid fibres, and/or para-aramid fibres. The fibres may be of any type, such as woven and/or chopped. Any suitable resin may be used, for example epoxy, BMI (bismaleimide), PEEK (polyetheretherketone), PTFE (polytetraflouroethylene), PAEK (polyaryletherketone), polyurethane, and/or polyamides (such as nylon).

In any example of electrical raft or electrical raft assembly, at least one of the electrical conductors embedded in the electrical raft may be an electrically conductive wire. The or each electrically conductive wire may be surrounded by an electrically insulating sleeve.

However, typically at least some (for example a plurality) of the electrical conductors may be provided in a flexible printed circuit (FPC). Indeed, in examples in which the electrical harness assembly described and claimed herein is at least partially embedded in an electrical raft, at least some of the electrical conductors are provided in the form of the FPCs that form part of the electrical harness. Thus, at least some of the electrical conductors may be provided as electrically conductive tracks in a flexible substrate. The flexible printed circuit may be flexible before being embedded in the rigid material.

Providing the electrical conductors as tracks in a flexible printed circuit may allow the size of the resulting electrical raft to be reduced further and/or substantially minimized. For example, many different electrical conductors may be laid into a flexible printed circuit in close proximity, thereby providing a compact structure. The flexible substrate of a single flexible printed circuit may provide electrical and/or mechanical protection/isolation to a large number of electrical conductors.

Any given electrical raft may be provided with both wires and flexible printed circuits laid therein.

It will be appreciated that any electrical conductors that are embedded in a rigid material (whether they are provided as embedded electrical wires or as conductive tracks in a flexible printed circuit embedded in the rigid material) may be described as being fixed in position by the rigid material, for example relative to the rest of the electrical harness raft. It will also be appreciated that the embedded electrical conductors may be said to be surrounded by the rigid material and/or buried in the rigid material and/or integral with (or integrated into) the rigid material.

An electrical raft (or electrical raft assembly) may comprise a fluid passage. Such a fluid passage may be embedded therein and/or otherwise provided thereto. The fluid passage may be part of a fluid system, such as a gas (for example pneumatic or cooling gas/air) and/or liquid (for example a fuel, hydraulic and/or lubricant liquid).

There is provided a method of assembling a rigid electrical raft and/or a gas turbine engine. The method comprises preparing a rigid electrical raft comprising the electrical harness assembly, including the connection formation and the encapsulating body, as described above and elsewhere herein. The method may comprise electrically and mechanically connecting the prepared electrical raft assembly to the rest of the apparatus/gas turbine engine.

Such an electrical electrical raft comprises one or more electrical connectors (or sockets), electrically connected to at least one of the embedded electrical conductors. The electrical connector or socket may allow electrical connection of the electrical raft to other electrical components, for example to other electrical rafts (either directly or indirectly, via an electrical cable or lead) or to electrical units (again, either directly or indirectly, via an electrical cable or lead).

The electrical raft may be a first engine installation component, and the gas turbine engine may further comprise a second engine installation component having electrical conductors. The gas turbine engine may further comprise at least one flexible cable connected between the electrical raft assembly and the second engine installation component so as to electrically connect electrical conductors of the electrical raft assembly with electrical conductors of the second engine installation component. The flexible cable may comprise one or more flexible printed circuits.

The second engine installation component may be, for example, an ECU, such as an EMU or EEC. Additionally or alternatively, the second engine installation component may be a further electrical raft or electrical raft assembly.

The environment of a gas turbine engine during operation may be particularly severe, with, for example, high levels of vibration and/or differential expansion between components as the temperature changes through operation and as the components move relative to each other. Providing at least one flexible cable to connect an electrical raft assembly to another component may allow the electrical rafts and/or components to accommodate vibration and/or relative movement, for example of the component(s)/assemblies to which they are attached/mounted during use. For example, the flexible cable(s) (where present) used to electrically connect electrical raft assemblies to other component(s) may have sufficient length to accommodate such vibration and/or movement during use.

For example, providing separate (for example more than one) electrical raft assemblies and connecting at least some (for example at least two) of them together using at least one flexible cable may allow the electrical rafts to accommodate vibration and/or relative movement of the component(s)/assemblies to which they are attached/mounted during use.

An electrical raft or raft assembly, or a flexible printed circuit (which may be a part of the electrical harness assembly described and claimed herein), may be provided in any suitable location/position of the gas turbine engine, for example to a mounting structure at any suitable location. For example, the gas turbine engine may comprise a bypass flow duct formed between an engine core and an engine fan casing (the gas turbine engine may be a turbofan engine, for example); and an electrical raft assembly may form at least a part of a radially extending splitter (which may be referred to as a bifurcation) that extends across the bypass flow duct. In this way, an electrical raft (which may be referred to as a splitter electrical raft) or a flexible printed circuit may provide an electrical connection between a fan casing and an engine core. By way of further example, the electrical raft assembly or flexible printed circuit may be attached to the engine core case or engine fan case, for example to a mounting structure on such cases.

Other components/systems of a gas turbine engine may be provided to an electrical raft assembly in any suitable manner. For example, such other components/systems may be mounted on one or more electrical raft assemblies. Thus, a surface of an electrical raft may be used as a mounting surface for other gas turbine engine components/systems, such as ancillary/auxiliary components/systems.

For example, an electrical unit may be mounted on an electrical raft. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). At least one (i.e. one or more) electrical unit may be attached to an electrical raft. Such an electrical raft assembly may be a particularly convenient, lightweight and/or compact way of providing (for example attaching, fixing or mounting) an electrical unit to a turbine engine. For example, the electrical unit and the electrical raft may be assembled together (mechanically and/or electrically) before being installed on the gas turbine engine, as described elsewhere herein. Such an electrical unit may be electrically connected to the electrical connector of the electrical harness assembly (for example in arrangements in which the electrical harness assembly is at least partially embedded in a rigid raft).

An electrical raft may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical raft may provide a stable, regular and convenient platform on which to mount the various systems/components. The combination of the installed electrical raft assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft (and thus to the engine) as required. For example, fluid pipes for transferring fluid around the engine may be mounted to the electrical rafts (for example mechanically mounted using a bracket), and thus to the engine. More than one set of fluid pipes, for example for carrying different or the same fluids, may be mounted on the same electrical raft.

An anti-vibration mount may be used to attach an electrical raft to another component, thereby allowing the electrical raft to be vibration isolated (or at least substantially vibration isolated). Using an anti-vibration mount to attach an electrical raft/assembly to a gas turbine engine for example may reduce (or substantially eliminate) the amount (for example the amplitude and/or the number/range of frequencies) of vibration being passed to the electrical raft from the gas turbine engine, for example during use. This may help to prolong the life of the electrical raft. Furthermore, any other components that may be attached to the electrical raft (as discussed above and elsewhere herein) may also benefit from being mounted to the gas turbine engine via the anti-vibration mounts, through being mounted on the electrical raft. For example, the reduced vibration may help to preserve the electrical contact between the electrical raft and any electrical unit connected thereto. As such, any components (such as an electrical unit mounted to the electrical raft) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly,

BRIEF DESCRIPTION OF THE DRAWINGS

Embodiments of the invention will now be described by way of example with reference to the accompanying drawings in which.

DETAILED DESCRIPTION OF THE PREFERRED EMBODIMENTS

Figure 8:
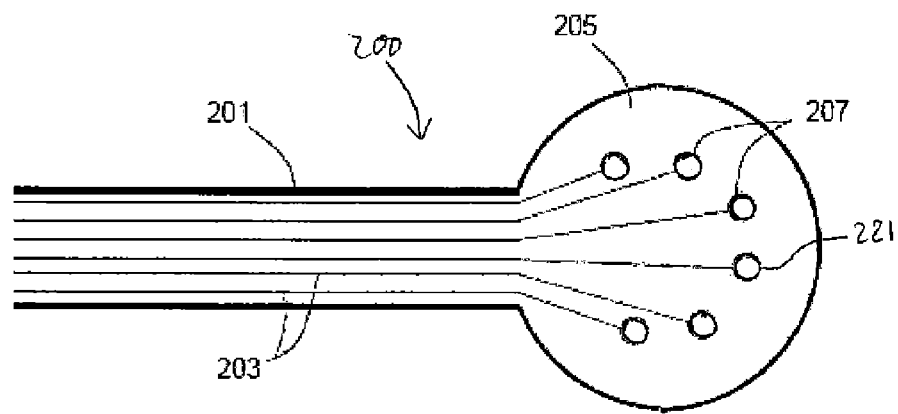
FIG. 8 shows schematically a portion of an electrical harness formed from a flexible printed circuit.

FIG. 8 shows schematically a portion of a gas turbine engine electrical harness 200 formed from a flexible printed circuit 201 which provides a plurality of conductive tracks 203, optionally in multiple layers. The portion ends at a terminating region 205. In the example of FIG. 8, the terminating region is substantially planar and disc shaped. The conductive tracks fan out in the terminating region 205 of FIG. 8 and join to respective receiving holes 207 which penetrate through the terminating region 205 perpendicularly to the plane of the region. The holes are internally plated with an electrically conductive layer 221.

Figure 9:
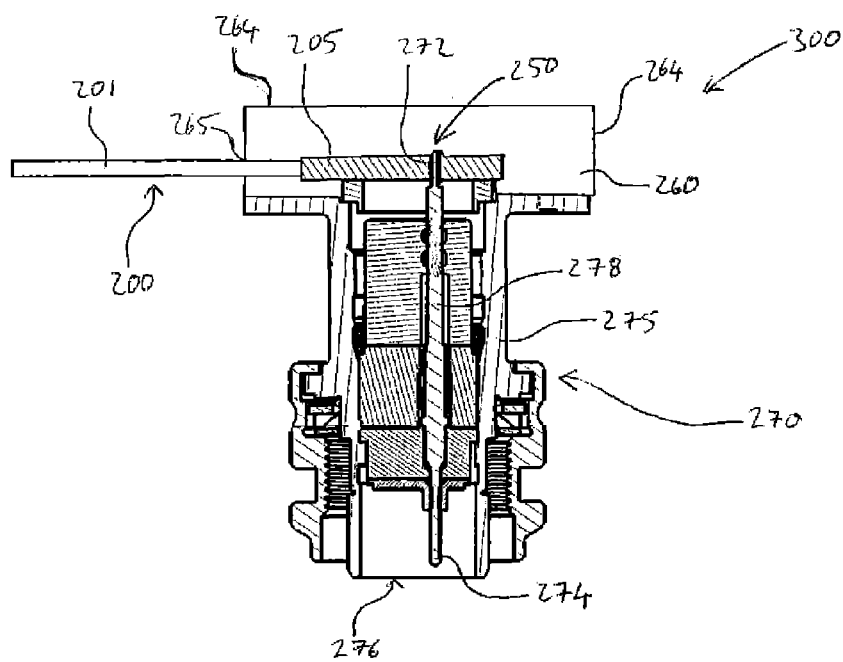
FIG. 9 shows schematically a transverse cross-sectional view through an electrical harness assembly according to an aspect of the invention.

FIG. 9 shows schematically a transverse longitudinal cross-sectional view through an electrical harness assembly 300. The electrical harness assembly 300 comprises an electrical harness 200 which may be substantially as described above in relation to FIG. 8. The electrical harness 200 is electrically connected to an electrical connector 270. The electrical connector 270 comprises at least one pin 278, which may be an elongate pin with a first end 272 and a second end 274, as in the example shown in FIG. 9.

The first end 272 of the pin 278 is received in one of the receiving holes 207 in the terminating region 205. Thus, the pin 278 may be connected to an electrical conductor (or track) 203 in the flexible printed circuit.

The second end 274 of the pin 278 is presented at an open end (or connection end) 276 of the connector 270. The second end 278 is available for electrical connection to another electrical component. Thus, the electrical conductors 203 in the flexible printed circuit 201 may be connected to another electrical component via the electrical connector 270.

Typically, the connector 270 comprises a plurality of pins 278, each having first ends 272 received in a respective receiving hole 207 and second ends 274 available for connection to another electrical component.

Although the pin 270 is shown to be a particular shape in FIG. 9, it will be appreciated that the pin 270 may have any suitable shape or form, for example any elongate shape.

The connection end 276 of the connector 270 may take any suitable form. For example, the connector end 276 may be a male connector (as in the FIG. 9 example) or a female connector.

The pins 278 may be held in position in the connector 270 using an insulating material, which may be any suitable material. In this way, the pins 278 may be help in position in the connector 270, for example during and/or after assembly of the electrical harness assembly 300. The pins 278 and insulating material may be contained within a connector shell 275.

The region at which the pins 270 connect to the electrical harness 200 via the receiving holes 207 in the terminating region 205 may be referred to as a connection formation 250. The connection formation 250 is encapsulated by an encapsulating body 260. The encapsulating body 260 completely surrounds the connection formation so as to seal it therein. By completely surrounding the connection formation 250, the encapsulating body 260 may, for example, surround any part of the connection formation 250 that would otherwise be exposed. For example, the connection formation 250 may comprise one or more regions that face into the connector 270, and it may not be necessary (or possible) for the encapsulating body 260 to extend around these regions. Thus, the encapsulating body 260 may be said to surround any parts of the connection formation 250 that would otherwise be exposed, in order to seal the connection formation 250.

The encapsulating body 260 may be in direct contact with the terminating regions 205 (including any integral parts of the terminating regions 205 such as, for example, any covering that a terminating region 205 may comprise on its surface).

An outer surface 264 of the encapsulating body 260 (which may be referred to as facing away from the connection formation 250) may form the outer surface of the electrical harness assembly itself, as in the FIG. 9 example. Thus, the encapsulating body 260 may be both in contact with the terminating regions 205 and form the outer, or external, surface of the assembly.

The encapsulating body 260 may have an aperture 265 through which the flexible printed circuit 201 exits (and thus extends from the connection formation 250), as shown in FIG. 9. The aperture 265 may be moulded around the flexible printed circuit 201 so as to form a tight (for example hermetic) seal around it, thereby ensuring that the internal parts of the connection formation (including the terminating regions 205 and the pins 278) are protected and/or sealed, and thus that the electrical connection between the electrical harness 205 and the electrical connector 270 is robust and reliable.

The encapsulating body 260 may be formed using any suitable material, such as a mouldable insulating material, for example a mouldable plastic, such as an epoxy resin. During manufacture, the encapsulating body 260 may be formed around the connection formation 250 (including the pins 278 and the terminating regions 205). Any suitable method may be used, such as injection moulding, or simply pouring molten plastic material into a mould in which the pins 278 and terminating regions 205 are located.

Figure 10:
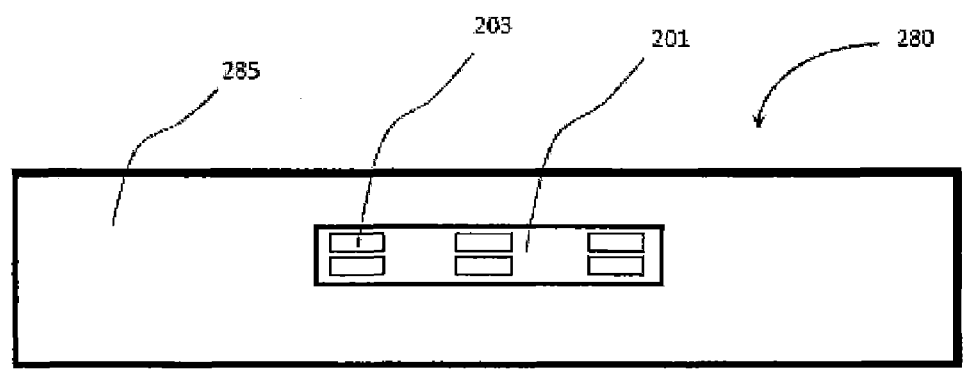
FIG. 10 shows a diagrammatic representation of a flexible printed circuit board embedded in a rigid material.
Figure 11:
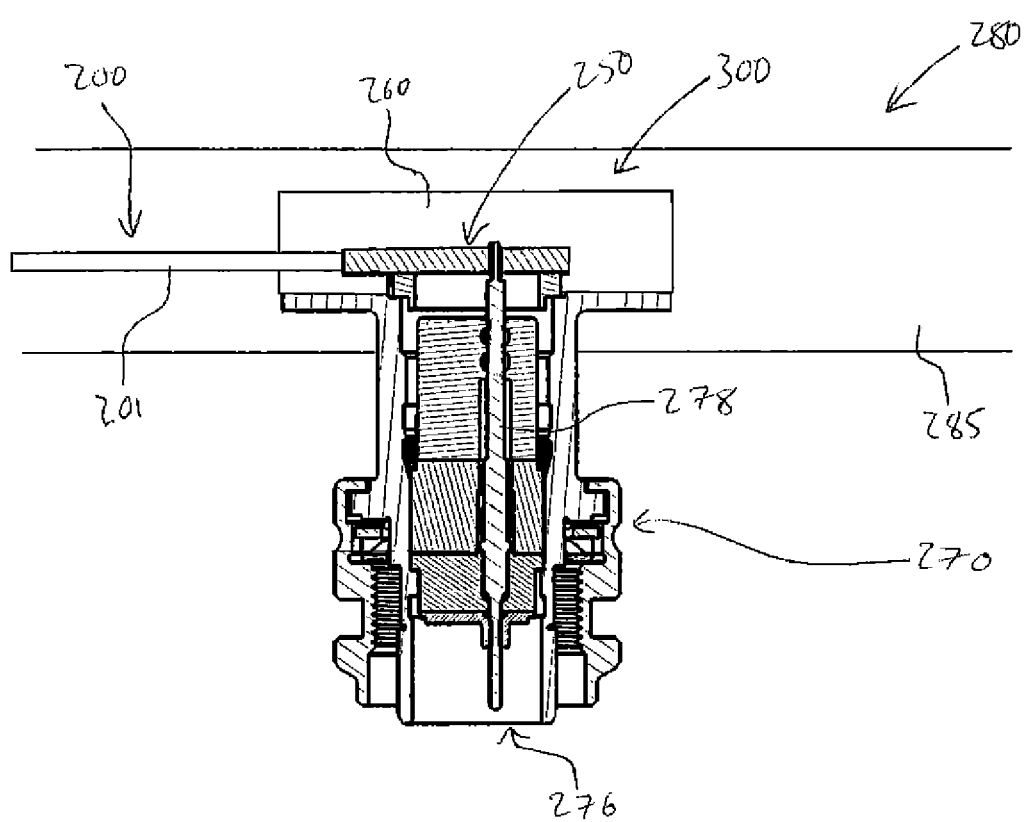
FIG. 11 shows a diagrammatic representation of an assembly an electrical harness assembly embedded in a rigid material to form a rigid electrical raft according to an aspect of the invention.

At least a part of the electrical harness assembly 300 (for example as shown in FIG. 9) may be embedded in a rigid material 285 so as to form a rigid raft, or rigid electrical raft. An example of such a rigid raft 280 is shown in FIG. 11. In FIG. 11, which shows a cross-section through a portion of a rigid raft 280, the connection portion 250 and the flexible printed circuit 201 are embedded in, and immobilized by, the rigid material 285. In this way, the electrical conductors 203 are also contained in the rigid raft 285. In this regard, FIG. 10 shows a cross-section through a rigid raft 280 in a plane that passes perpendicular to the length direction of the flexible printed circuit 201, showing the electrical conductors 203.

The encapsulating body 260 may be particularly advantageous during the manufacture of such a rigid raft 280. For example the encapsulating body may provide protection to the connection formation 250, for example if high pressure resin is injected around the connection formation 250 during manufacture of the rigid raft 280, or if the assembly is subjected to high pressure and/or temperature, for example during a curing process.

The rigid material 285 may be, for example, a composite material of fibre and filler, such as carbon fibre. Any suitable method may be used to manufacture such a rigid structure 280 such as, for example, placing the flexible printed circuit board 201 between flexible layers of a composite material (or "laying-up" the flexible composite material), and then moulding to the desired shape and treating (for example heat and/or pressure treating) to form a rigid composite structure.

As shown in FIG. 11, a portion of the electrical connector 270 may extend from the rigid material 285. For example, as shown in the FIG. 11 example, the connector end 276 may extend away from the rigid material 285 so as to be available for connection to another electrical component outside the rigid raft 280. Such an electrical component may (or may not) be mechanically mounted onto a surface of the rigid raft 280.

Figure 1:
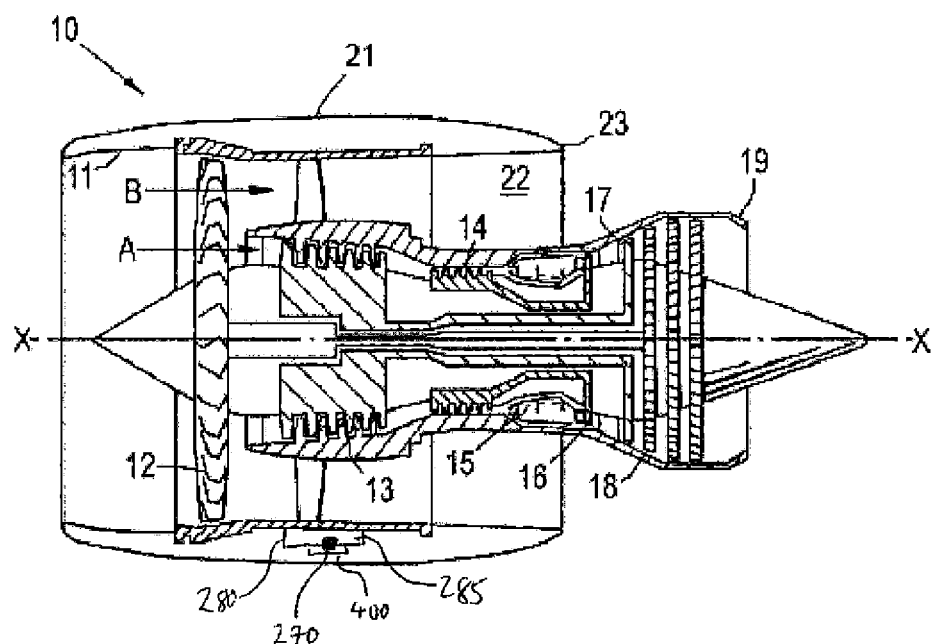
FIG. 1 shows a schematic longitudinal cross-sectional view through a ducted fan gas turbine engine in accordance with aspects of the invention.
Figure 2:
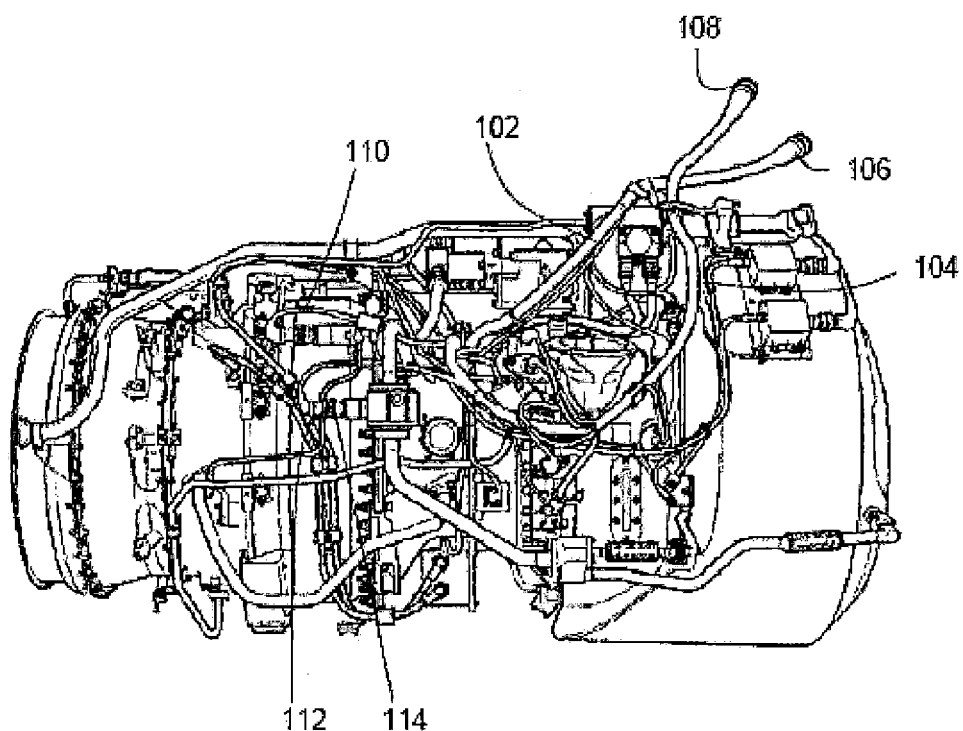
FIG. 2 shows a gas turbine engine with a conventional harness.
Figure 3:
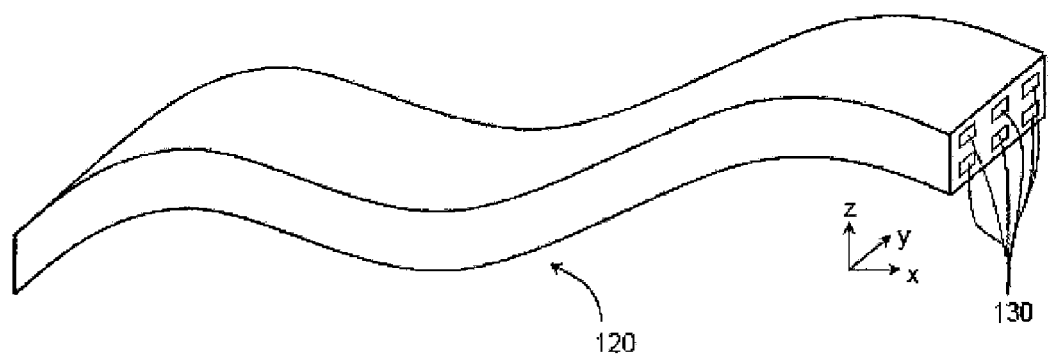
FIG. 3 shows a schematic perspective view of a portion of a flexible printed circuit.
Figure 4:
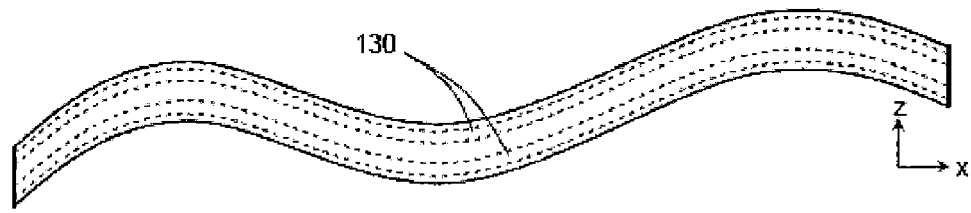
FIG. 4 shows a side view of the flexible printed circuit of FIG. 3.
Figure 5:
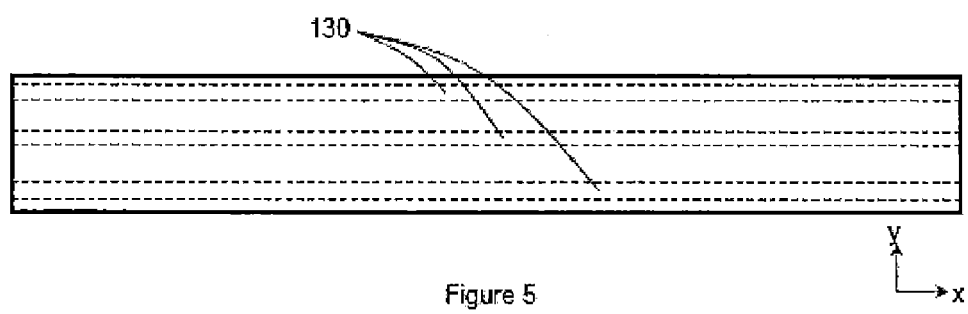
FIG. 5 shows a top view of the flexible printed circuit of FIG. 3.
Figure 6:
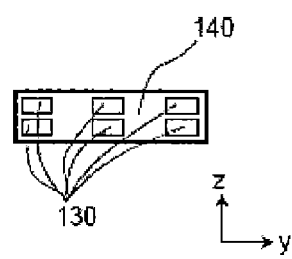
FIG. 6 shows a transverse cross-sectional view of the flexible printed circuit of FIG. 3.
Figure 7:
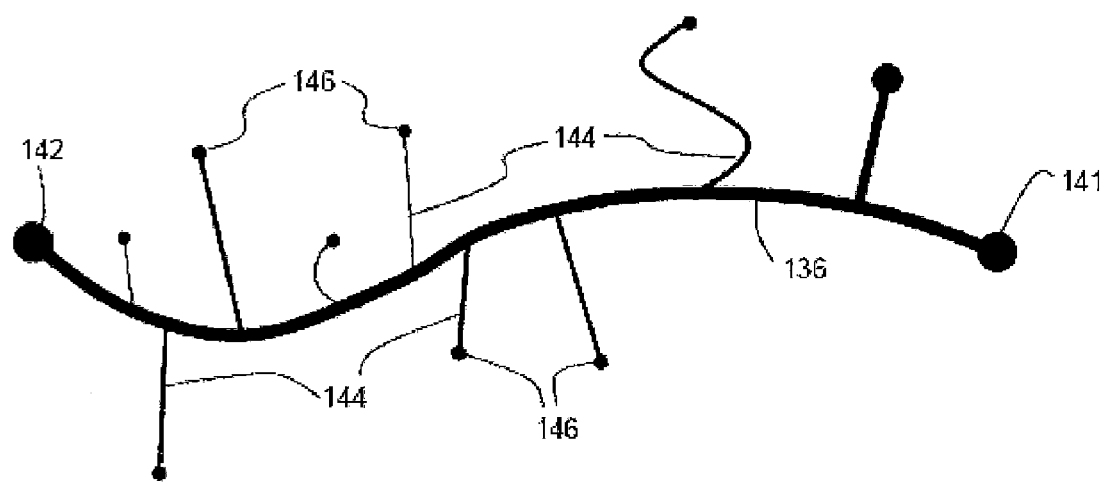
FIG. 7 shows a diagrammatic representation of a flexible printed circuit for an engine.

Such a rigid raft 280 with at least a part of the electrical harness assembly 300 embedded in a rigid material 285 is also shown mounted in the gas turbine engine 10 of FIG. 1. In the example of FIG. 1, the rigid raft 280 is mounted on the fan casing of the gas turbine engine, but such a rigid raft 280 may be mounted in any suitable location. In the FIG. 1 example, an electrical unit 400 (which could be any electrical unit 400, such as an EEC, an EMU, and/or an ECU) is mounted on the rigid raft 280. The electrical unit 400 is electrically connected to the rigid raft 280 using the electrical connector 270. In this way, the electrical unit 400 may be mechanically mounted to the engine 10 and electrically connected to other electrical components with which it needs to communicate using the rigid raft 280. Although not explicitly shown or labelled in FIG. 1 for simplicity, the rigid raft 280 may have embedded therein at least a part of an electrical harness assembly 300 having any one or more of the features/components described by way of example herein.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the scope of the invention.

We claim:

1. An electrical harness assembly comprising:
   an electrical harness including: (i) a flexible printed circuit having a plurality of conductive tracks, and (ii) a terminating region at which each conductive track terminates at a receiving hole, each receiving hole being electrically connected to a respective electrical track;
   an electrical connector including elongate terminals each having a first end received in one of the receiving holes, thereby forming a connection formation where the elongate terminals are electrically connected with the conductive tracks, and the elongate terminals each having a second end configured to connect to a complimentary connector; and
   an encapsulating body continuously surrounding the connection formation in a single, continuous body, the encapsulating body being in direct contact with the connection formation, the encapsulating body forming a non-releasable body around the connection formation and permanently sealing the connection formation within the encapsulating body.

2. The electrical harness assembly according to claim 1, wherein the encapsulating body is a homogeneous body formed around the connection formation.

3. The electrical harness assembly according to claim 1, wherein the encapsulating body forms a hermetic seal around the connection formation.

4. The electrical harness assembly according to claim 1, wherein the encapsulating body is formed from a moldable insulating material.

5. The electrical harness assembly according to claim 1, wherein an outer surface of the electrical harness assembly is formed by the encapsulating body.

6. The electrical harness assembly according to claim 1, wherein:
   the electrical connector includes a housing; and
   the elongate terminals are supported in the housing such that the second ends of the elongate terminals are configured to connect to a complimentary connector at an open end of the housing.

7. The electrical harness assembly according to claim 1, wherein each terminating region is substantially planar, each receiving hole is arranged such that the elongate terminals extend out of a plane of the terminating region.

8. An electrical raft comprising a rigid material having embedded in the rigid material at least a part of the electrical harness assembly according to claim 1.

9. The electrical raft according to claim 8, wherein the rigid material is a rigid composite material.

10. The electrical raft according to claim 8, wherein a first part of the electrical connector is embedded in the rigid material, and a second part of the electrical connector extends away from the rigid material.

11. The electrical raft according to claim 8, wherein the second ends of the elongate terminals extend away from the electrical raft so as to be configured to connect to an external complimentary connector.

12. A gas turbine engine having an electrical system comprising the electrical raft according to claim 8.

13. A gas turbine engine having an electrical system comprising the electrical harness assembly according to claim 1.

14. A method of providing an electrical harness with an electrical connector for connection to a complimentary connector, the electrical harness including a flexible printed circuit having a plurality of conductive tracks, the method comprising:

forming a terminating region of the electrical harness at which each conductive track terminates at a receiving hole, each receiving hole being electrically connected to a respective electrical track;

providing an electrical connector including elongate terminals each having a first end and a second end;

fitting the first end of each elongate terminal in a respective one of the receiving holes, thereby forming a connection formation where the elongate terminals are electrically connected with the conductive tracks;

presenting the second end of each elongate terminal for connection to a complimentary connector; and encapsulating the connection formation by surrounding the connection formation with an insulating material forming a single, continuous encapsulating body that is in direct contact with the connection formation forming a non-releasable body around the connection formation and permanently sealing the connection formation within the encapsulating body.

15. The method of providing the electrical harness with the electrical connector according to claim 14, wherein the step of encapsulating the connection formation includes injection molding the insulating material around the connection formation.

* * * * *